United States Patent [19]

Lee et al.

[11] Patent Number: 5,063,176
[45] Date of Patent: Nov. 5, 1991

[54] FABRICATION OF CONTACT HOLE USING AN ETCH BARRIER LAYER

[75] Inventors: Won G. Lee, Kangwon; Mi Y. Kang, Seoul, both of Rep. of Korea

[73] Assignee: Hyundai Electronics Industries Co., Ltd., Kyungki, Rep. of Korea

[21] Appl. No.: 530,644

[22] Filed: May 30, 1990

[30] Foreign Application Priority Data

May 30, 1989 [KR] Rep. of Korea .............. 89-7209

[51] Int. Cl.$^5$ .................. H01L 21/441; H01L 21/465
[52] U.S. Cl. ........................ 437/195; 437/913; 437/982; 437/228; 437/241; 156/653
[58] Field of Search ............ 437/195, 913, 29, 56, 437/228, 58, 43, 34

[56] References Cited

U.S. PATENT DOCUMENTS

| | | | |
|---|---|---|---|
| 4,299,862 | 11/1981 | Donley | 156/653 |
| 4,560,436 | 12/1985 | Bukhman et al. | 204/192.32 |
| 4,620,361 | 11/1986 | Matsukawa et al. | 437/43 |
| 4,686,000 | 8/1987 | Heath | 437/241 |
| 4,824,767 | 4/1989 | Chambers et al. | 156/653 |

FOREIGN PATENT DOCUMENTS 0155699  9/1985  European Pat. Off. .......... 437/982

Primary Examiner—Brian E. Hearn
Assistant Examiner—Michael Trinh
Attorney, Agent, or Firm—Merchant, Gould, Smith, Edell, Welter & Schmidt

[57] ABSTRACT

A method of forming a contact hole in a semiconductor device while maintaining intended electrical isolation of electrical conductive material layers, even in the presence of mask misalignment/excessive etching which may occur during the fabrication process of the contact hole and the resulting device are disclosed. The method comprises the formation of an etch barrier layer to provide an isotropic etching barrier and an electrically insulating layer for the conductive material layers which are positioned proximate the contact hole. Thus, when the contact hole is formed by anisotropically etching to expose the surface of the diffusion region an electrical short cannot occur between conductive material layers proximate the contact hole and conductive material which is deposited into the contact hole.

8 Claims, 3 Drawing Sheets

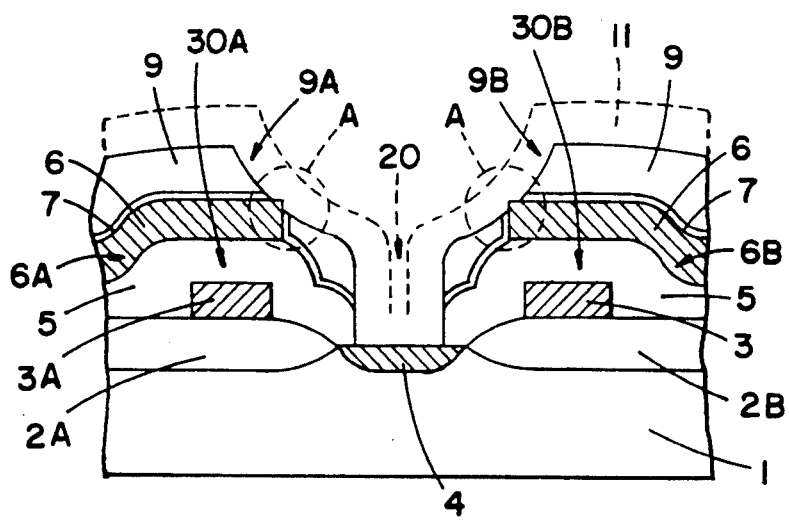
FIG. IA
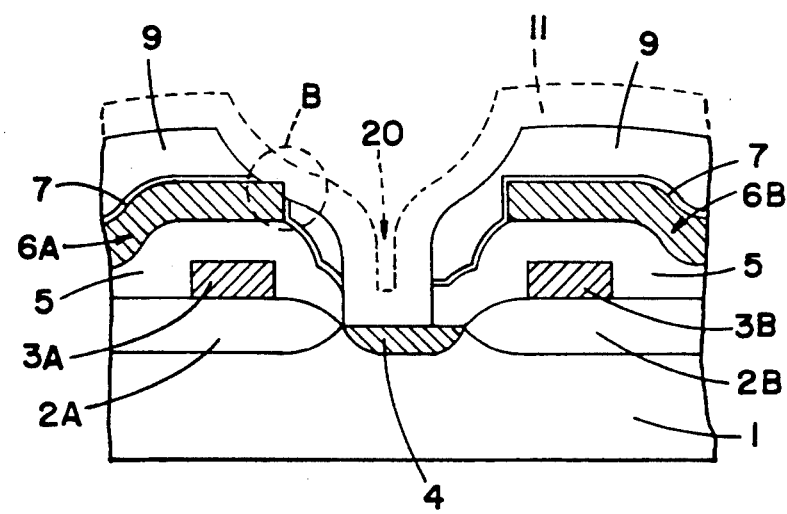
FIG. IB
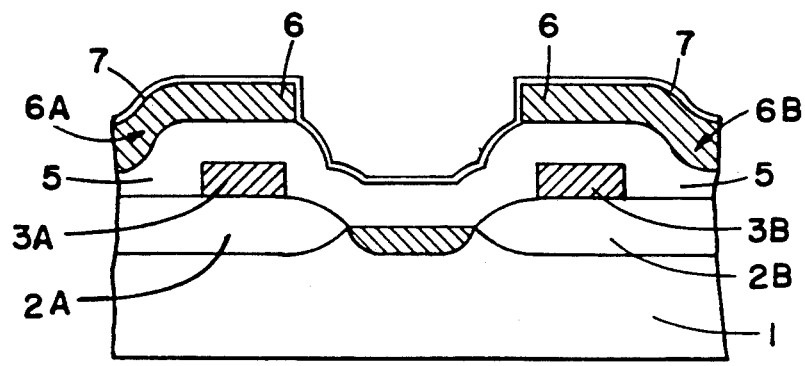
FIG. 2A

FABRICATION OF CONTACT HOLE USING AN ETCH BARRIER LAYER

BACKGROUND OF THE INVENTION

1. Field of the Invention

This invention relates to a method for forming a contact hole in a semiconductor device, and more particularly, to a method for forming a contact hole by utilizing an etch barrier layer in the semiconductor device. The barrier prevents current leakage or an electrical short circuit between an underlying conductive material layer, a portion of which is unintentionally exposed in the contact hole due to excessive etching of insulating films formed on the underlying conductive material layers or to inaccurate etching resulting from mask misalignment during the fabrication process and conductive material which is placed into the contact hole.

2. Information Disclosure Statement

The area of a contact hole or via hole used in the process for manufacturing semiconductor devices has been reduced as the integrity of semiconductor device increases, thereby resulting in increasing the aspect ratio of the contact hole or via hole.

In the prior art, when a contact hole or via hole is formed between MOSFETs or on the MOSFET and to electrically connect a conductive material layer to the MOSFET through the contact hole or via hole, many kinds of etching methods, which can smooth a step coverage of the conductive material layer deposited in the contact hole, for example, an etching method in the form of the combination of isotropic etching and anisotropic etching of the insulating film positioned where the contact hole is to be formed, an etching method which utilizes the flowing of a portion of the top of the insulating film after anisotropic etching of the insulating film, an anisotropic etching method which transfers the rounded photoresistive pattern for contact mask to the insulating film, etc. can be utilized.

Specifically, as illustrated in FIG. 1A, the etching method in the form of the combination of isotropic etching and anisotropic etching etches away a potion of the insulating film 7, which protects the conductive material layer 6A, 6B, due to the excessive etching of the third insulating film 9 during the isotropic etching to smooth the step coverage of the conductive material layer to be formed on the third insulating film 9 by the rounding of the portion of insulating film positioned where the contact hole is formed, thereby causing a short circuit between the conductive material layers 6A, 6B and a conductive material 11 if another conductive material layer 11 as illustrated in dotted line in FIG. 1A is deposited on the entire surface of the structure.

Also, if the contact mask is misaligned as illustrated in FIG. 1B and the third insulating film 9 is then isotropically etched, a portion, for example, the portion "B", of the second insulating film 7 is excessively etched away, thereby exposing a portion of the conductive material layer 6A, which also results in a short circuit between the conductive material layer 6A and a conductive material layer 11 to be formed later.

Unlikely, even though a portion of the conductive material layer 6A, 6B is not exposed, if the second insulating film 7 does not have sufficient thickness so that it cannot exhibit the desired insulating effect, current leakage occurs between the conductive material layer 6A, 6B and a conductive material layer 11 to be formed on the entire surface of the structure. Thus, it may result in the malfunction of the semiconductor device.

Therefore, it is an object of the present invention to provide a method for forming a contact hole by utilizing an etch barrier layer having a significantly different etching selectivity from the insulating film formed on the etch barrier layer in order to prevent the conductive material layer underlying the insulating film from being exposed due to the excessive etching of the insulating film positioned where the contact hole is formed, or to prevent a portion of the insulating film from being partially etched due to the contact mask misalignment as well as maintaining a predetermined thickness of the insulating film between the conductive material layers when the etching process is performed.

SUMMARY OF THE INVENTION

According to the present invention, it is characterized in that in order to protect the insulating film formed on the conductive material layer, the contact hole forming process is performed utilizing an etch barrier layer on the insulating film so that it is possible to prevent an electrical short between the conductive material layers, thereby improving the semiconductor device.

The present invention may be summarized as a method of forming a contact hole in a semiconductor device while maintaining intended electrical isolation of electrically conductive material layers, even in the presence of mask misalignment or excessive etching occurring during the fabrication process of the contact hole. The method comprises forming field oxide films spaced apart relative to each other on a silicon substrate and then forming gate electrodes on each of the field oxide films by a gate mask patterning process. A diffusion region is formed by ion implantation into the portion of the silicon substrate between the spaced apart field oxide films for use as either a source electrode or a drain electrode to define MOSFETs. A first insulating layer is deposited on the entire surface of the resulting structure followed the depositing of a conductive material layer 6 on the first insulating layer. A portion of the conductive material layer deposited above the diffusion region is etched away by the mask patterning process of the conductive material layer thereby forming conductive material layers on a portion of the first insulating film proximate the diffusion region. A second insulating film is deposited on the entire surface of the resulting structure. An etch barrier layer is then deposited on the second insulating film to a predetermined thickness on the second insulating film to provide an isotropic etching barrier and an electrically insulating layer thereby protecting the conductive material layers. A third insulating film is deposited on the entire resulting structure. The third insulating film must have an etching selectivity ratio which enables the third insulating film to be isotropically etched relative the etch barrier layer. The third insulating film is "flowed" or planerized in order to smooth the surface of the structure. A photoresistive layer is deposited on the entire resulting surface. A portion of the photoresistive layer positioned over the diffusion region is etched to form a contact mask pattern. The third insulating film is isotropically etched to form a rounded opening having a bottom positioned over the diffusion region. A contact hole is formed by anisotropically etching through the bottom of the rounded opening in the third insulating film, the second insulating film and the first insulating film by the contact mask patterning process. This process exposes the surface of the diffusion region and because of the etch barrier layer an electrical short cannot occur between conductive material layers proximate the walls of the contact hole and a conductive material deposited into the contact hole.

The present invention further includes the semiconductor device prepared by the above method. This device comprises field oxide films which are spaced apart relative to each other on a silicon substrate. A gate electrode is formed on each of the field oxide films. A diffusion region is formed into a portion of the silicon substrate between the spaced apart field oxide films for use as either a source electrode or a drain electrode, thereby each defining MOSFET. A first insulating layer is deposited over the entire surface of the resulting structure except for the portion above the diffusion region. A conductive material layer is positioned on the first insulating layer above each of the gate electrodes, respectively. A second insulating film is deposited on the entire surface of the resulting structure, except for the portion above the diffusion region. An etch barrier layer is deposited on the second insulating film, except for the portion above the diffusion region, to provide an isotropic etching barrier and an electrically insulating layer to protect the conductive material layers. A third insulating film is deposited on the entire resulting structure, except for the portion above the diffusion region which defines an opening formed therein and positioned over the diffusion region. A contact hole extends from the opening in the third insulating film to expose the surface of the diffusion region. The structure of this device prevents an electrical short occurring between the conductive material layers which are proximate the contact hole and a conductive material which is positioned into the contact hole.

BRIEF DESCRIPTION OF THE DRAWINGS

For fuller understanding of the nature and objects of the invention, reference should be had to the following detailed description taken in conjunction with the accompanying drawing in which:

FIGS. 1A and 1B illustrate cross-sectional views of a semiconductor device in which an insulating film positioned where a contact hole is formed according to the prior art is excessively etched, or a portion of the insulating film is etched due to the contact mask misalignment, thereby exposing a portion of the conductive material layer;

FIGS. 2A through 2D illustrate cross-sectional views of the process steps for forming a contact hole according to the present invention.

DETAILED DESCRIPTION OF THE DRAWINGS

Figure 2B:
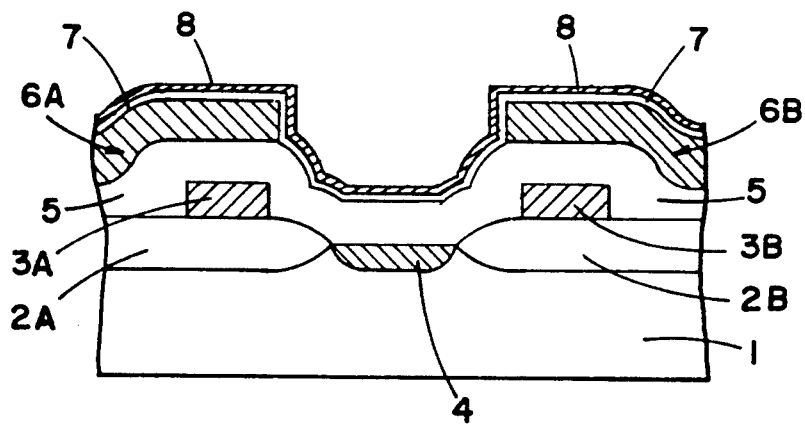

FIGS. 1A and 1B illustrate cross sectional views of a semiconductor device in which a contact hole is formed according to the prior art.

In the structure of the semiconductor device depicted in FIGS. 1A and 1B, field oxide films 2A, 2B spaced from each other are formed in a silicon substrate 1, and gate electrodes 3A, 3B are formed on the respective portions of field oxide films 2A, 2B by a gate mask patterning process. Then, a diffusion region 4, which can be used as a source electrode or a drain electrode, is formed by ion implantation into the portion of the silicon substrate 1 positioned between the field oxide films 2A, 2B, and a drain electrode or a source electrode is formed proximate the outer ends, not shown, of the respective field oxide films 2A, 2B, thereby forming MOSFETs 30A, 30B. In order to insulate the gate electrodes 3A, 3B from conductive material layers 6A, 6B to be formed later, a first insulating film 5, preferably, an oxide film, is deposited on the entire surface. A conductive material layer 6, which can be utilized as an electrode of stacked capacitor or an internal connection line depending upon the predetermined purpose, is deposited, and the respective conductive material layers 6A, 6B are formed on the respective portion of the first insulating film by the mask patterning process of the conductive material layer 6. Next, a second insulating film 7 is deposited on the entire surface. In order to smooth the outline of the semiconductor device, a third insulating film, preferably, PSG (Phospho-Silicate-Glass) or BPSG (Boro-Phospho-Silicate-Glass), is deposited on the entire surface, and is then flowed or planerized to smooth the surface. After a contact mask pattern, not shown, is formed on a portion of the third insulating film 9 positioned on the diffusion region 4 where the contact hole is to be formed, and a rounding process is performed by isotropically etching the third insulating film 9 to form respective a rounded opening 9A, 9B with a bottom 9C in the third insulating film 9. A portion of each rounded third insulating film, the second insulating film 7 and the first insulating film 5 is anisotropically etched by the contact mask patterning process to form the contact, thereby exposing the surface of the diffusion region 4.

It should be noted that before the first, second and third insulating films are etched to form the contact hole, the reason why a portion of the third insulating film 9 over the diffusion region is isotropically etched, that is the rounding process is then performed to form the respective rounded opening portions 9A, 9B of the third insulating film 9, is to smooth the step coverage of conductive material layer for bit line with the step coverage being made during the deposition of the conductive material layer for bit line to connect the conductive material layer for the bit line to the diffusion region through the contact hole.

FIG. 1A further illustrates a cross sectional view of a semiconductor device in which before the contact hole is formed by anisotropic etching, when a rounding process is performed to form the respective portions 9A, 9B of the third insulating layer 9 with isotropic etching, for example, wet etching, a portion of the second insulating film 7 is unintentionally etched away due to excessive etching of the third insulating film 9, thereby exposing the respective portions A of the conductive material layers 6A and 6B.

The cross-sectional view of FIG. 1B illustrates a semiconductor device in which a portion of the second insulating layer 7 is etched away due to the mask misalignment which may occur in arrangement of the contact mask, not shown, on the third insulating film 9 positioned over the diffusion region 4, thereby exposing a portion B of the conductive material layer 6A. Accordingly, in the structures illustrate in FIG. 1A and 1B, when another conductive material layer 11 is deposited on the entire surface of both structure including the exposed portion of the diffusion region 4 by the formation of the contact hole 20, an electrical short between the exposed portions of the conductive material layer 6A, 6B and the conductive material layer 11, or leak current occurs.

FIGS. 2A through 2D illustrate cross-sectional views of the process steps for forming a contact hole according to the present invention.

Referring to FIG. 2A, field oxide films 2A, 2B spaced from each other are formed in a silicon substrate 1 and gate electrode 3A, 3B are formed on the respective portions of field oxide films 2A, 2B by a gate mask patterning process. Then, a diffusion region 4, which can be used as a source electrode or a drain electrode, is formed by ion implantation into the portion of the silicon substrate 1 positioned between the field oxide films 2A, 2B, and a drain electrode or a source electrode is formed proximate the outer ends, not shown, of the respective field oxide films 2A, 2B, thereby forming MOSFETs 30A, 30B. In order to insulate the gate electrodes 3A, 3B from conductive material layers 6A, 6B to be formed later, a first insulating film 5, preferably, an oxide film, is deposited on the entire surface. A conductive material layer 6 is deposited and the respective conductive material layers 6A, 6B are formed on the respective portions of the first insulating film by the mask patterning process of the conductive material layer 6. Next, a second insulating film 7 is deposited on the entire surface.

FIG. 2B illustrates a cross section of a semiconductor device in which an etch barrier layer 8, preferably, a nitride film, having a significantly different etching selectivity ratio from the third insulating film 9, is deposited on the second insulating layer 7 to a predetermined thickness on the entire surface of the structure illustrated in FIG. 2B.

Figure 2C:
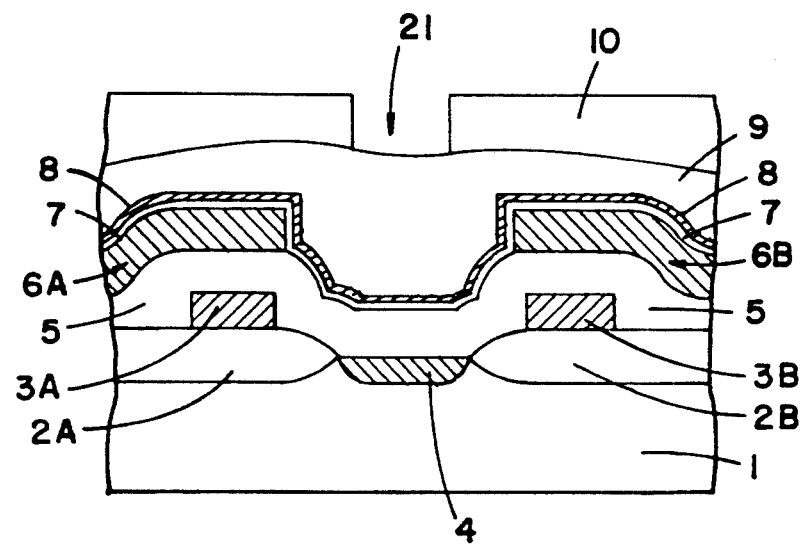

FIG. 2C illustrates a cross section of a semiconductor device in which after the etch barrier layer is deposited, a third insulating film 9, for example, BPSG or PSG, is deposited on the entire surface and then flowed in order to smooth the surface of the structure, and after a photoresistive layer, which can be used for a contact mask, is deposited on the entire surface, a portion of the photoresistive layer 10 over the diffusion region 4 is etched to form a contact mask pattern 21.

Figure 2D:
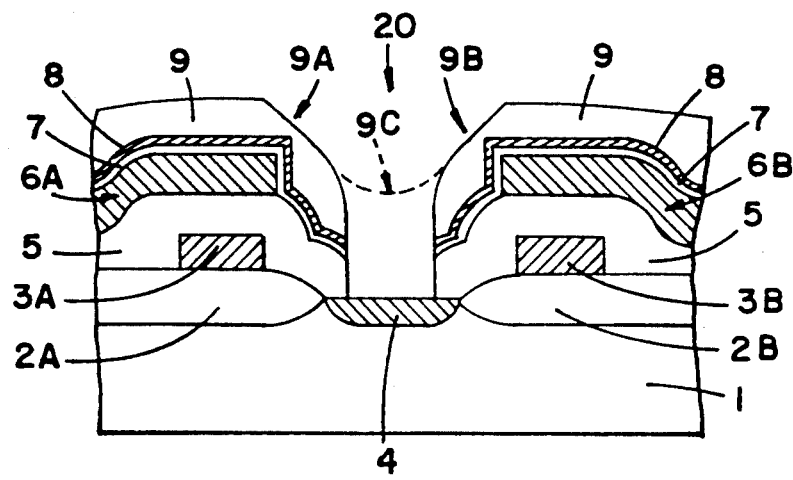

FIG. 2D is a cross sectional view of the semiconductor device in which the rounding process has been performed by isotropic etching of the third insulating layer 9 to form a rounded opening 9A, 9B having a bottom 9C in the third insulating film 9 followed by anisotropic etching through the remaining third insulating film 9, etch barrier layer 8, second insulating film 7 and first insulating film 5 over the diffusion region 4 to from a contact hole 20. The contact hole exposes a portion of the top surface of the diffusion region 4. The photoresistive layer 10 is removed.

The structure described in conjunction with FIG. 2A through 2B includes an ideal contact hole 20. However, in the process of performing the rounding process for the respective portions 9A, 9B of the third insulating film 9 with isotropic etching of the third insulating film 9, the problem in the prior art caused by etching of the portion A, B of the third insulating layer 9 (refer to FIGS. 1A and 1B) due an excessive etching or the mask misalignment which may occur very often during the etching process can be solved as described below.

Figure 3A:
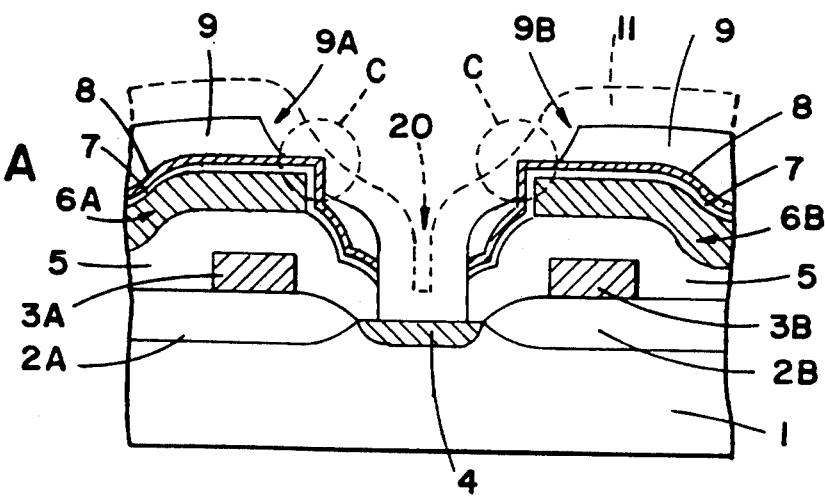
FIGS. 3A and 3B illustrate cross-sectional views of a semiconductor device in which even though a portion of the insulating film is etched due to contact mask misalignment and excessive etching of the insulating film, the conductive material layer on the insulating film and the conductive material layer in the contact hole are protected by the etch barrier layer used in forming the contact hole according to the present invention.

FIG. 3A illustrates a cross sectional view of a semiconductor device in which before forming a contact hole 20 in the structure illustrated in FIG. 2D, even though an excessive etching of the third insulating layer 9 occurs during the rounding process for the respective portions 9A, 9B of the third insulating film 9 underlying the contact mask 21 with isotropic etching, the second insulating film 7 cannot be etched by the etch barrier layer 8 so that the respective conductive material layer 6A, 6B are not exposed as illustrated in "C".

Figure 3B:
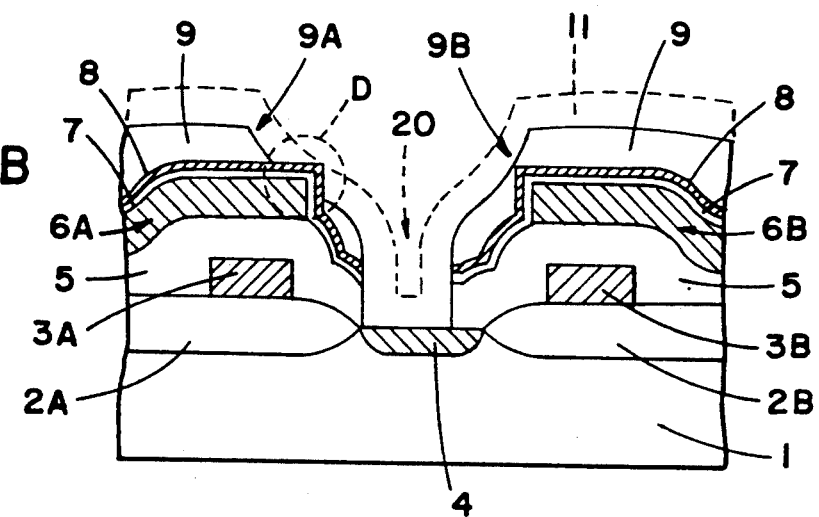

FIG. 3B illustrates a cross sectional view of a semiconductor device in which even when the third insulating film 9 is partially etched with the contact mask pattern misalignment, the etch barrier layer 8 protects the second insulating film 7 against the etching, thus, the respective conductive material layer 6A, 6B are not exposed as illustrated in "D".

Therefore, according to the present invention, nevertheless a semiconductor device has such structures illustrated in FIGS. 3A and 3B, the undesirable electrical short circuit does not occur between the respective conductive material layers 6A, 6B, and the conductive material layer 11.

As described above, according to the present invention, since the insulating film 7 is deposited on the respective conductive material layers, and the etch barrier layer 8 is utilized, current leakage can be prevented as well as an undesirable electrical short circuit between the respective conductive material layers 6A, 6B, and the conductive material layer 11.

The foregoing description of the preferred embodiment has been presented for the purpose of illustration and description. It is not intended to limit the scope of the invention. Many modifications and variations are possible in the light of the above teaching. It is intended that the scope of the invention be defined by the claims.

What is claimed is:

1. A method for forming a contact hole by utilizing an etch barrier layer in a semiconductor device, the method comprising the steps of:

forming MOSFETs on a silicon substrate, each MOSFET having a field oxide film formed on the silicon substrate, a gate electrode formed on the field oxide film and a diffusion region formed into the silicon substrate between the field oxide films with the diffusion region being used as a source electrode or a drain electrode;

depositing a first insulating film on the entire surface;

forming conductive material layers on each portion of the first insulating film positioned on the gate electrodes of each MOSFET by a mask patterning process of the conductive material layer;

depositing a second insulating film on the entire surface to insulate the conductive material layers from each other;

forming an etch barrier layer on the second insulating film;

depositing a third insulating film on the entire surface of the etch barrier layer and then flowing the same;

forming a contact mask pattern for contact hole on the third insulating film positioned over the source electrode by utilizing a photoresistive layer as a contact mask; and performing a rounding process of a portion of the third insulating film by isotropically etching a portion of the third insulating film along the contact mask pattern; and, forming a contact hole by anisotropically etching a portion of the rounded third insulating film, a portion of the etch barrier layer, a portion of the second insulating film and a portion of the first insulating film, thereby preventing the second insulating film from being etched when the rounding process of a portion of the third insulating is performed by isotropically etching a portion of the third insulating film.

2. The method of claim 1 wherein the first and the second insulating films are oxide films.

3. The method of claim 1 wherein the third insulating film is selected form the group consisting of: Phospho-Silicate-Glass film and Boro-Phospho-Silicate-Glass film.

4. The method of claim 1 wherein the etch barrier layer is a nitride film.

5. A method of forming a contact hole in a semiconductor device while maintaining intended electrical isolation of electrically conductive material layers, even in the presence of mask misalignment/excessive etching occurring during the fabrication process of the contact hole, said method comprising:

forming field oxide films 2A, 2B spaced apart relative to each other on a silicon substrate 1;

forming gate electrodes 3A, 3B on each of the field oxide films 2A, 2B by a gate mask patterning process;

forming a diffusion region 4 by ion implantation into the portion of the silicon substrate between the spaced apart field oxide films 2A, 2B for use as either a source electrode or a drain electrode, thereby forming MOSFETs 30A, 30B;

depositing a first insulating layer 5 on the entire surface of the resulting structure;

depositing a conductive material layer 6 on the first insulating layer 5;

etching away a portion of the conductive material layer deposited above the diffusion region by the mask patterning process of the conductive material layer 6 thereby forming conductive material layers 6A, 6B on a portion of the first insulating film;

depositing a second insulating film 7 on the entire surface of the resulting structure;

depositing an etch barrier layer 8 to a predetermined thickness on the second insulating film 7 to provide an isotropic etching barrier and an electrically insulating layer thereby protecting the conductive material layers 6A, 6B;

depositing a third insulating film 9 on the entire resulting structure and the third insulating film 9 having an etching selectivity ratio which enables the third insulating film to be isotropically etched;

flowing the third insulating film in order to smooth the surface of the structure;

depositing a photoresistive layer on the entire resulting surface;

etching a portion of the photoresistive layer 10 positioned over the diffusion region 4 to form a contact mask pattern 21;

isotropically etching the third insulating film 9 to form a rounded opening 9A, 9B, having a bottom positioned over the diffusion region 4, in a portion of the third insulating film 9; and, forming a contact hole by anisotropically etching through the bottom of the rounded opening in the third insulating film, the second insulating film 7 and the first insulating film 5 by the contact mask patterning process to expose the surface of the diffusion region 4 such that an electrical short occurring between conductive material layers 6A,6B and a conductive material 11 deposited into the contact hole is prevented.

6. The method of claim 5 wherein the first and the second insulating films are oxide films.

7. The method of claim 5 wherein the third insulating film is selected form the group consisting of: Phospho-Silicate-Glass film and Boro-Phospho-Silicate-Glass film.

8. The method of claim 5 wherein the etch barrier layer is a nitride film.

* * * * *

UNITED STATES PATENT AND TRADEMARK OFFICE
CERTIFICATE OF CORRECTION

PATENT NO. : 5,063,176
DATED : November 5, 1991
INVENTOR(S) : Lee et al.

It is certified that error appears in the above-identified patent and that said Letters Patent is hereby corrected as shown below:

Column 2, line 42; insert --by-- after the word "followed".

Column 4, line 29; "After" should read --Afterward--.

Column 4, line 34; "respective" should read --respectively--.

Column 5, line 2; "illustrate" should read --illustrated--.

Column 5, line 57; "from" should read --form--.

Column 5, line 68; "an" should read --to--.

Column 8, line 37, claim 7: "form" should read --from--.

Signed and Sealed this

Eleventh Day of May, 1993

Attest:

MICHAEL K. KIRK

Attesting Officer

Acting Commissioner of Patents and Trademarks